Figure 1:
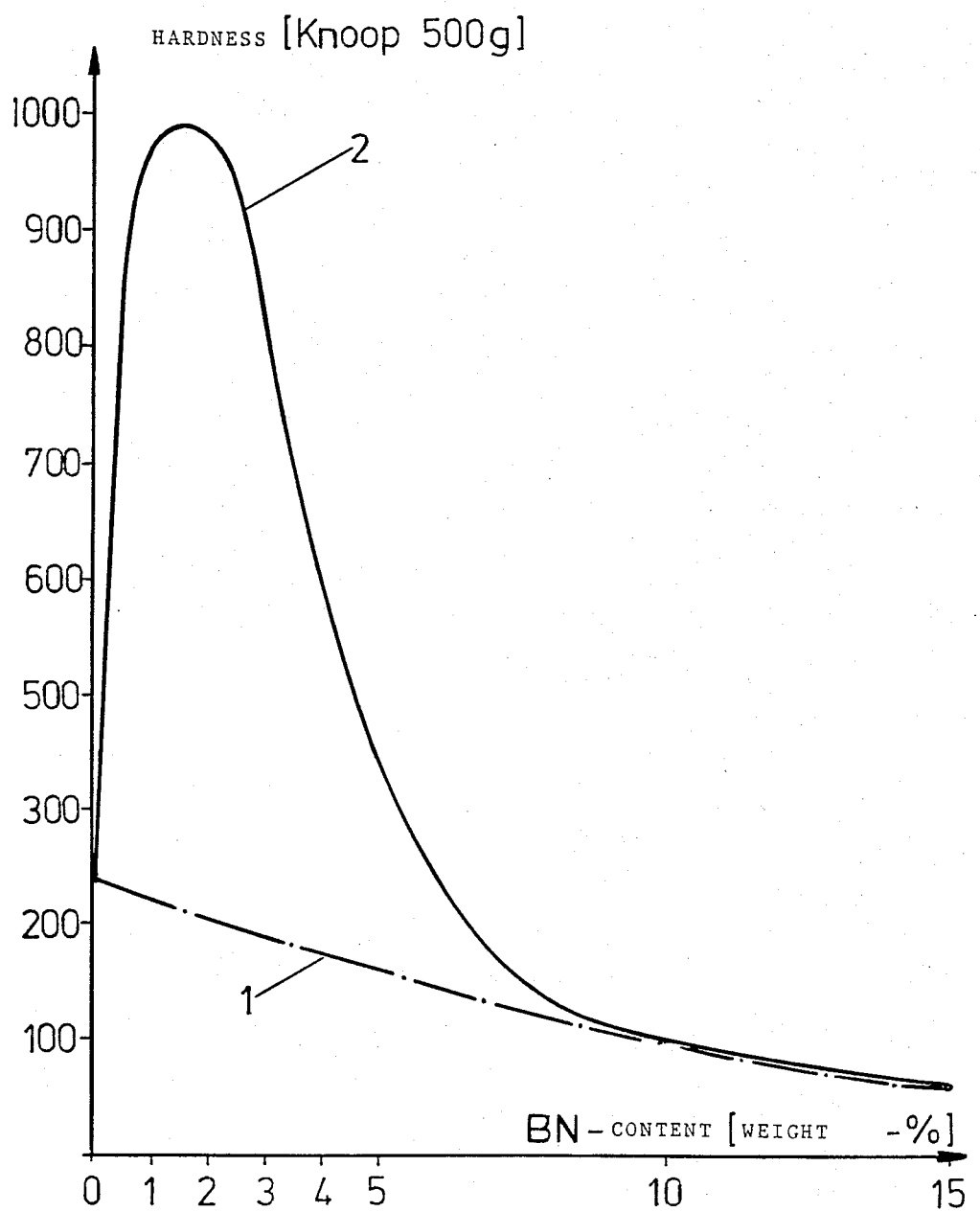

United States Patent [19]

Aldinger et al.

[11] Patent Number: 4,519,966
[45] Date of Patent: May 28, 1985

[54] LOW-CONTAMINATION ALN CRUCIBLE FOR MONOCRYSTAL PULLING AND METHOD

[75] Inventors: Fritz Aldinger, Rodenbach; Richard Keilberth, Kleinheubach; Waltraud Werdecker, Hanau, all of Fed. Rep. of Germany

[73] Assignee: W. C. Heraeus GmbH, Hanau, Fed. Rep. of Germany

[21] Appl. No.: 563,647

[22] Filed: Dec. 20, 1983

[30] Foreign Application Priority Data

Dec. 24, 1982 [DE] Fed. Rep. of Germany ....... 3248103

[51] Int. Cl.$^3$ ...................... C04B 35/58; C30B 15/10; C30B 35/00
[52] U.S. Cl. ............................ 264/56; 156/DIG. 83; 264/65; 264/66; 264/67; 422/249; 501/96; 501/98; 501/152
[58] Field of Search ...................... 501/96, 98; 264/65, 264/66, 56, 67; 423/412, 290; 156/616 A, DIG. 83, 617 SP; 422/249

[56] References Cited

U.S. PATENT DOCUMENTS

| | | | |
|---|---|---|---|
| 3,108,887 | 10/1963 | Lenie et al. | 501/98 |
| 3,473,894 | 10/1969 | Babl et al. | 423/290 |
| 3,718,490 | 2/1973 | Morgan et al. | 423/412 |
| 3,813,252 | 5/1974 | Lipp | 501/98 |
| 3,833,389 | 9/1974 | Komeya et al. | 501/96 |
| 3,930,875 | 1/1976 | Ochiai et al. | 501/98 |
| 4,097,293 | 6/1978 | Komeya et al. | 501/98 |
| 4,188,194 | 2/1980 | Corrigan | 423/290 |
| 4,289,503 | 9/1981 | Corrigan | 423/290 |

FOREIGN PATENT DOCUMENTS

| | | | |
|---|---|---|---|
| 1289712 | 2/1969 | Fed. Rep. of Germany . | |
| 50-8800 | 1/1975 | Japan | 423/290 |
| 54-122682 | 9/1979 | Japan | 156/DIG. 83 |
| 58-32073 | 2/1983 | Japan . | |
| 1065728 | 4/1967 | United Kingdom . | |

OTHER PUBLICATIONS

Komeya, K. et al., "Effect of Various Additives on Sintering of Aluminum Nitride", Yogyo-Kyokai-Shi, 89(1981), pp. 330-334, (Eng. transl'n).
Long, G. et al., "Aluminum Nitride Containers for the Synthesis of GaAs-J. of Electrochem. Soc. 109, (1962), pp. 1176-1179.
Ryatsev, K. et al., "Effect of Some Additives on the Fritting and Micro-Structure on Aluminum Nitride Ceramics"–Chem. Abstr., vol. 95, 11386t.
Chem. Abstracts, vol. 99, (Jul. 25, 1983), p. 274, Abstr. #26975r.

Primary Examiner—Helen M. McCarthy
Attorney, Agent, or Firm—Frishauf, Holtz, Goodman & Woodward

[57] ABSTRACT

A low contamination crucible for pulling monocrystals of Group III and Group V elements of the Periodic Table, comprising particularly aluminum nitride with an additive of boron nitride or a rare earth oxide. The additive concentration is up to 5% by weight, but preferably 0.5% to 3% by weight. The hardness of the crucible of the invention is 300 to 400% greater than that of undoped material subjected to the same sintering conditions.

7 Claims, 2 Drawing Figures

LOW-CONTAMINATION ALN CRUCIBLE FOR MONOCRYSTAL PULLING AND METHOD

Cross reference to related application, assigned to the assignee of the present application, the disclosure of which is hereby incorporated by reference: "HEAT CONDUCTIVE CERAMIC SUBSTRATE" U.S. Ser. No. 563,026, filed Dec. 19, 1983 ALDINGER et al (claiming priority of German Application P 32 47 985.9-33 of Dec. 24, 1982).

The present invention relates generally to crucibles for pulling or vertically growing single semiconductor crystals, and more particularly to pulling semiconductor crystals which are compounds of elements of Group III of the periodic table, and elements of Group V of the periodic table.

BACKGROUND

It is known from British Pat. No. 1,065,728 to make a crucible for pulling of monocrystals from aluminum nitride or boron nitride. German Published Application DE-AS 1,289,712 discloses an evaporator for the vacuum deposition on workpieces of metal films, which comprise, in whole or in part, aluminum nitride and/or aluminum boride and/or silicon nitride and in some instances boron nitride. With this evaporator, one can provide up to 10% by weight boron nitride to make processing easier. It is also known to make crucibles of pyrolytic boron nitride in the production of high-purity, specially-doped semiconductor compounds. These crucibles have the disadvantage that they are extremely expensive and shed a layer after every cycle, so that the monocrystal pulling process must be adjusted each time to the changed dimensions.

THE INVENTION

It is an object to provide a self-supporting mechanically stable crucible for contamination-free growing of single crystal semiconductor compounds. Briefly, it has been discovered that a suitable material for such a crucible comprises aluminum nitride with an additive of hexagonal boron nitride, or aluminum nitride with the additive of up to 5% by weight of one or more rare earth oxides. Preferably, the concentration of these additives is about 0.5 to 3% by weight. It is particularly advantageous if the rare earth oxide additive comprises gadolinium oxide, lanthanum oxide, samarium oxide and/or yttrium oxide. The crucible of the present invention has the advantages that it is self-supporting, has great solidity, and is economical to manufacture.

THE DRAWINGS

Figure 2:
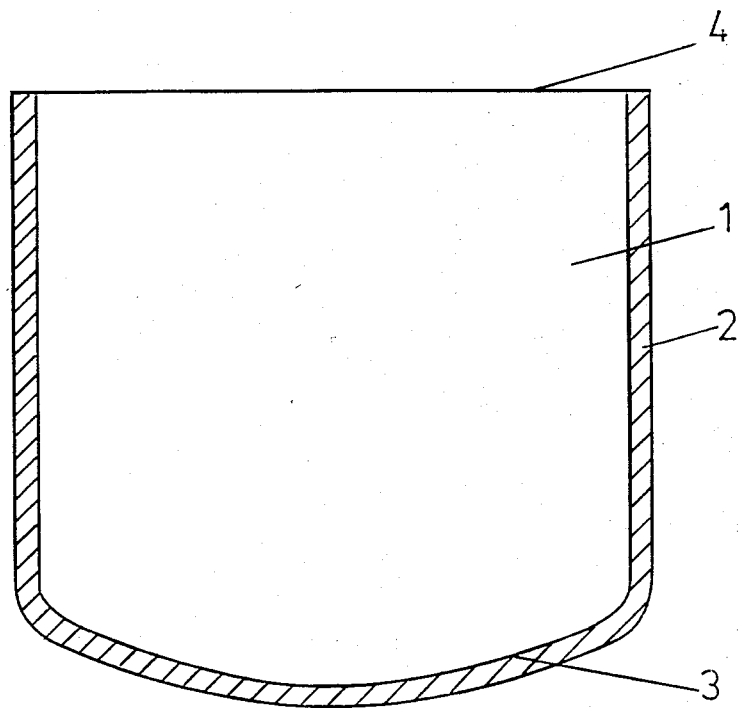

FIG. 1 is a graph of the dependence of the hardness of the crucible material against the percentage concentration of boron nitride; and FIG. 2 is a vertical cross-section through a crucible made in accordance with the invention.

In view of the fact that hexagonal boron nitride is very soft and is used in a manner similar to graphite as a lubricant or to reduce tensile strength, one would expect that the dependence of the hardness on the concentration of added boron nitride would correspond to curve 1 and that the hardness would decline with increasing boron nitride content. Surprisingly, aluminum nitride with up to 5% by weight boron nitride additives exhibits a substantial climb in hardness (curve 2). Depending upon the quantity of additives, one can reach a very high relative density. The best success was achieved with a boron nitride additive concentration in the range 0.5 to 3.0% by weight. The hardness of this material is between 300% and 400% above that of undoped material under the same sintering conditions. The hardness increase is connected with an increase in the density and in the mechanical solidity. The crucible can be manufactured by unpressurized sintering. The use of rare earth oxides achieves the same results in terms of good compressibility and solidity of the crucible and of freeness from contamination.

EXAMPLE 1000 grams of a pulverized mixture comprising 99% by weight aluminum nitride and 1% by weight hexagonal boron nitride was milled for 25 hours in a ceramic vessel with 1000 grams of ceramic grinding medium. This mixture was sieved through a sieve with a mesh size of 200 micrometers. 880 grams of the powder thus prepared was cold isostatically pressed at 2400 bars over a mandrel with a diameter of 90 mm and a length of 120 mm. After opening of the pressing form and the removal of the crucible from the mandrel, the crucible was preserved [until further processing by sintering] in a drying chamber at 80° C. until further processing by sintering.

After introduction of the crucible into a graphite heated sintering apparatus on a sintering support of molybdenum sheet, the apparatus was evacuated to $10^{-5}$ millibars and a nitrogen atmosphere was introduced and adjusted to a pressure of 5 millibars. Within three hours, the temperature was raised to 1300° C. During this period, a nitrogen pressure of 5 millibars was maintained. At 1300° C. the nitrogen pressure was permitted to rise to 140 millibars and the valve was shut. Within an hour the temperature was raised to 1800° C. At this temperature, the nitrogen pressure had reached 190 millibars. After a two-hour holding period under these conditions, the apparatus was shut off and allowed to cool to room temperature over the course of 12 hours. Then the apparatus was vented and the crucible removed.

Because of the very good resulting quality of the surface on the inside of the crucible, no further mechanical finishing steps are necessary there. The outisde can, if desired, be finished by dry grinding.

It is equally possible, when the sintering apparatus permits it, to work at higher nitrogen pressures. It is, however, essential to use nitrogen as the sintering atmosphere.

As shown in FIG. 2, the self-supporting crucible of the present invention has an inner space 1 with a circular cross-section and an inner wall 2, which is either vertical or inclined up to 5°, and which stretches to the floor region 3 of the vessel. In the case of an inclined inner wall 2, the inner diameter of the vessel is greatest at the rim of the upper opening 4. The wall and floor can have the same or different thicknesses. The floor surface inside the crucible has a curved configuration. The transition zone between the floor and wall is also smoothly curved. It is equally possible to configure the floor surface with a curve at the transition zone to the wall or to give it a completely semi-circular cross-section.

The aluminum nitride and hexagonal boron nitride used as raw materials are obtained from aluminum powder by reaction with nitrogen and from boron oxide by reaction with ammonia, respectively.

It is claimed:

1. A method of making a low-contamination crucible for pulling of monocrystals, particularly semiconductor compounds of Group III and Group V elements, consisting essentially of at least 97% by weight aluminum nitride and 0.5% to 3% by weight boron nitride, comprising the steps of:
   (1) milling a particle mixture of aluminum nitride and hexagonal boron nitride to a powder with a maximum particle diameter of less than 200 micrometers;
   (2) cold isostatically pressing said powder over a mandrel at a pressure of approximately 2400 bars to form a crucible shape;
   (3) thereafter placing said crucible shape in a pressure-controlled sintering chamber;
   (4) evacuating said sintering chamber to a pressure of less than 1 millibar;
   (5) introducing nitrogen as a substantially inert gas atmosphere;
   (6) raising the pressure of said substantially inert gas to at least 5 millibars;
   (7) raising the temperature in said sintering chamber to 1300° C.;
   (8) thereafter raising the substantially inert gas pressure to 140 millibars;
   (9) further raising the temperature in said sintering chamber to 1800° C. within one hour and permitting the substantially inert gas pressure to rise to 190 millibars;
   (10) holding said crucible at 1800° C. for two hours; and
   (11) allowing the crucible to cool to room temperature.

2. A low-contamination crucible, made by the method of claim 1, for pulling of monocrystals, particularly semiconductor compounds of Group III and Group V elements.

3. A method of making a low-contamination crucible for pulling of monocrystals, particularly semiconductor compounds of Group III and Group V elements, consisting essentially of at least 97% by weight aluminum nitride and 0.5% to 3% by weight of a rare earth oxide, comprising the steps of:
   (1) milling a particle mixture of aluminum nitride and at least one rare earth oxide to a powder with a maximum particle diameter of less than 200 micrometers;
   (2) cold isostatically pressing said powder over a mandrel at a pressure of approximately 2400 bars to form a crucible shape;
   (3) thereafter placing said crucible shape in a pressure-controlled sintering chamber;
   (4) evacuating said sintering chamber to a pressure of less than 1 millibar;
   (5) introducing nitrogen as a substantially inert gas atmosphere;
   (6) raising the pressure of said substantially inert gas to at least 5 millibars;
   (7) raising the temperature in said sintering chamber to 1300° C.;
   (8) thereafter raising the substantially inert gas pressure to 140 millibars;
   (9) further raising the temperature in said sintering chamber to 1800° C. within one hour and permitting the substantially inert gas pressure to rise to 190 millibars;
   (10) holding said crucible at 1800° C. for two hours; and
   (11) allowing the crucible to cool to room temperature.

4. A low-contamination crucible, made by the method of claim 3, for pulling of monocrystals, particularly semiconductor compounds of Group III and Group V elements.

5. The crucible of claim 4, wherein said rare earth oxide comprises a mixture of at least two oxides selected from the group consisting of gadolinium oxide, lanthanum oxide, samarium oxide and yttrium oxide.

6. A method according to claim 3, wherein said rare earth oxide is selected from the group consisting of gadolinium oxide, lanthanum oxide, samarium oxide and yttrium oxide.

7. A low-contamination crucible, made by the method of claim 6, for pulling of monocrystals, particularly semiconductor compounds of Group III and Group V elements.

* * * * *